(12) United States Patent
VanBuskirk et al.

(10) Patent No.: US 6,622,201 B1
(45) Date of Patent: Sep. 16, 2003

(54) CHAINED ARRAY OF SEQUENTIAL ACCESS MEMORIES ENABLING CONTINUOUS READ

(75) Inventors: Michael VanBuskirk, Saratoga, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/525,078

(22) Filed: Mar. 14, 2000

Related U.S. Application Data

(60) Provisional application No. 60/178,766, filed on Jan. 28, 2000.

(51) Int. Cl.[7] .............................................. G06F 12/00
(52) U.S. Cl. ..................... 711/104; 711/101; 711/103; 711/105
(58) Field of Search ................................ 711/101, 103, 711/105, 104

(56) References Cited

U.S. PATENT DOCUMENTS

| | | | | |
|---|---|---|---|---|
| 5,280,594 A | | 1/1994 | Young et al. ................ 711/157 |
| 5,311,473 A | * | 5/1994 | McClure et al. ............ 365/201 |
| 5,390,333 A | * | 2/1995 | Pritt et al. ................... 713/324 |
| 5,410,680 A | | 4/1995 | Challa et al. ................. 703/24 |
| 5,432,729 A | * | 7/1995 | Carson et al. ................. 365/63 |
| 5,519,847 A | * | 5/1996 | Fandrich et al. ........ 365/185.33 |
| 5,555,209 A | | 9/1996 | Smith et al. ............. 365/189.05 |
| 5,983,327 A | * | 11/1999 | Achilles et al. ......... 365/189.02 |
| 6,052,756 A | * | 4/2000 | Barnaby et al. ............. 711/105 |
| 6,070,227 A | * | 5/2000 | Rokicki ....................... 711/111 |
| 6,108,745 A | * | 8/2000 | Gupta et al. ................. 711/127 |
| 6,122,216 A | * | 9/2000 | Dykes .................... 365/230.03 |
| 6,215,713 B1 | * | 4/2001 | Austin ......................... 365/205 |
| 6,405,286 B2 | * | 6/2002 | Gupta et al. ................. 711/127 |

* cited by examiner

Primary Examiner—Reba I. Elmore

(57) ABSTRACT

A sequential access memory structure includes an output bus and a plurality of sequential access memories, each of which is connected to the output bus. Each memory includes a memory array having a plurality of sequentially readable memory elements, a carry output for producing a carry signal when reading of the array has been substantially completed, and a carry input for causing reading of the array in response to a carry signal. The carry output of each memory is connected to a carry input of one other downstream memory respectively in a chain arrangement, and the carry signals cause the arrays to be read sequentially onto the output bus. Each memory further comprises a read-write storage connected between the array and the output bus, the storage including a plurality of sections. Data from the array is loaded into one section of the storage while data is being read from another section of the storage onto the output bus. The sections of memory elements in the array comprise half-pages. The storage comprises two sections, each of which has a half-page of memory elements, and the carry output produces the carry signal prior to reading data from a last half-page of the array out of the storage onto the output bus. Data from the last half-page is read onto the output bus while data from a first half-page of an array of a next downstream memory is being loaded into its storage.

22 Claims, 3 Drawing Sheets

CHAINED ARRAY OF SEQUENTIAL ACCESS MEMORIES ENABLING CONTINUOUS READ

CROSS REFERENCE TO RELATED APPLICATION

This application claims the benefit of provisional U.S. patent application Ser. No. 60/178,766, filed Jan. 28, 2000.

Any additional fees required in connection with this communication which are not specifically provided for herewith are authorized to be charged to deposit account no. 01-2520 in the name of Arter & Hadden, LLP. Any overpayments are also authorized to be credited to this account.

TECHNICAL FIELD

The present invention generally relates to the art of microelectronic integrated circuits, and more specifically to a chained array of sequential access memories which enables continuous read.

BACKGROUND ART

Sequential access memories have been developed which have advantages and disadvantages relative to conventional random access memories. In a sequential access memory, individual addresses are not accessible directly. The memory is organized in pages of, for example, 512 bytes each, and it is necessary to read out an entire page or half page in order to obtain the data stored at any particular address on the page. A preferred example of a sequential access memory is the Am30LV0064D UltraNAND™, which is commercially available from Advanced Micro Devices, Inc. (AMD) of Sunnyvale, Calif. This memory is a Flash ROM device based on NAND architecture.

Compared to sequential access non-volatile memories, random access ROMs require more physical pins and connections, mainly for address lines, cost significantly more for the same bit density, and are not available in as high a density as sequential access memories.

Sequential access memories, on the other hand, generally require a command sequence to be written to the device in order to select and make a set of information readable. They can only read information from sequential locations in the memory until a new command sequence is written, and thus only support straight line program execution.

The AMD UltraNAND memory has a conventional read command which causes a single 512 byte page of data to be loaded into an input/output storage register in parallel, and output in series.

There is a 7 microsecond latency period at the beginning of the read operation during which the data is loaded into the register, and then data can be serially output at approximately 50 nanoseconds/byte.

The UltraNAND memory also has a "gapless" read command which enables all of the memory pages to be read out with only a single 7 microsecond latency period at the beginning of the operation. This is accomplished by loading one half-page of data into one section of the register while outputting a previously loaded half-page from another section of the register in an "pingpong" manner until the entire memory has been read.

Although the gapless read command enables a single UltraNAND memory to be read out with only 7 microsecond latency, it does not enable a plurality of UltraNAND memories to read out continuously. For each memory that is to be read, it is necessary to individually input the read command sequence, which itself requires a substantial amount of time, and then read out the data with at least one 7 microsecond latency period for loading the first half-page of data into the input/output register.

SUMMARY OF THE INVENTION

The present invention overcomes the limitations of the prior art by providing a sequential access memory which can be chained together with similar memories to form a memory array that can be read out continuously. In accordance with the present invention, the read command sequence is loaded into all of the memories simultaneously, and the memories are then read out sequentially with only a single 7 microsecond latency at the beginning of the read operation.

More specifically, a sequential access memory structure according to the present invention includes an output bus and a plurality of sequential access memories, each of which is connected to the output bus. Each memory includes a memory array having a plurality of sequentially readable memory elements, a carry output for producing a carry signal when reading of the array has been substantially completed, and a carry input for causing reading of the array in response to a carry signal. The carry output of each memory is connected to a carry input of one other downstream memory respectively in a chain arrangement, and the carry signals cause the arrays to be read sequentially onto the output bus.

Each memory further comprises a read-write storage connected between the array and the output bus, the storage including a plurality of sections.: Data from the array is loaded into one section of the storage while data is being read from another section of the storage onto the output bus.

The sections of memory elements in the array comprise half-pages. The storage comprises two sections, each of which has a half-page of memory elements, and the carry output produces the carry signal prior to reading data from a last half-page of the array out of the storage onto the output bus. Data from the last half-page is read onto the output bus while data from a first half-page of an array of a next downstream memory is being loaded into its storage.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
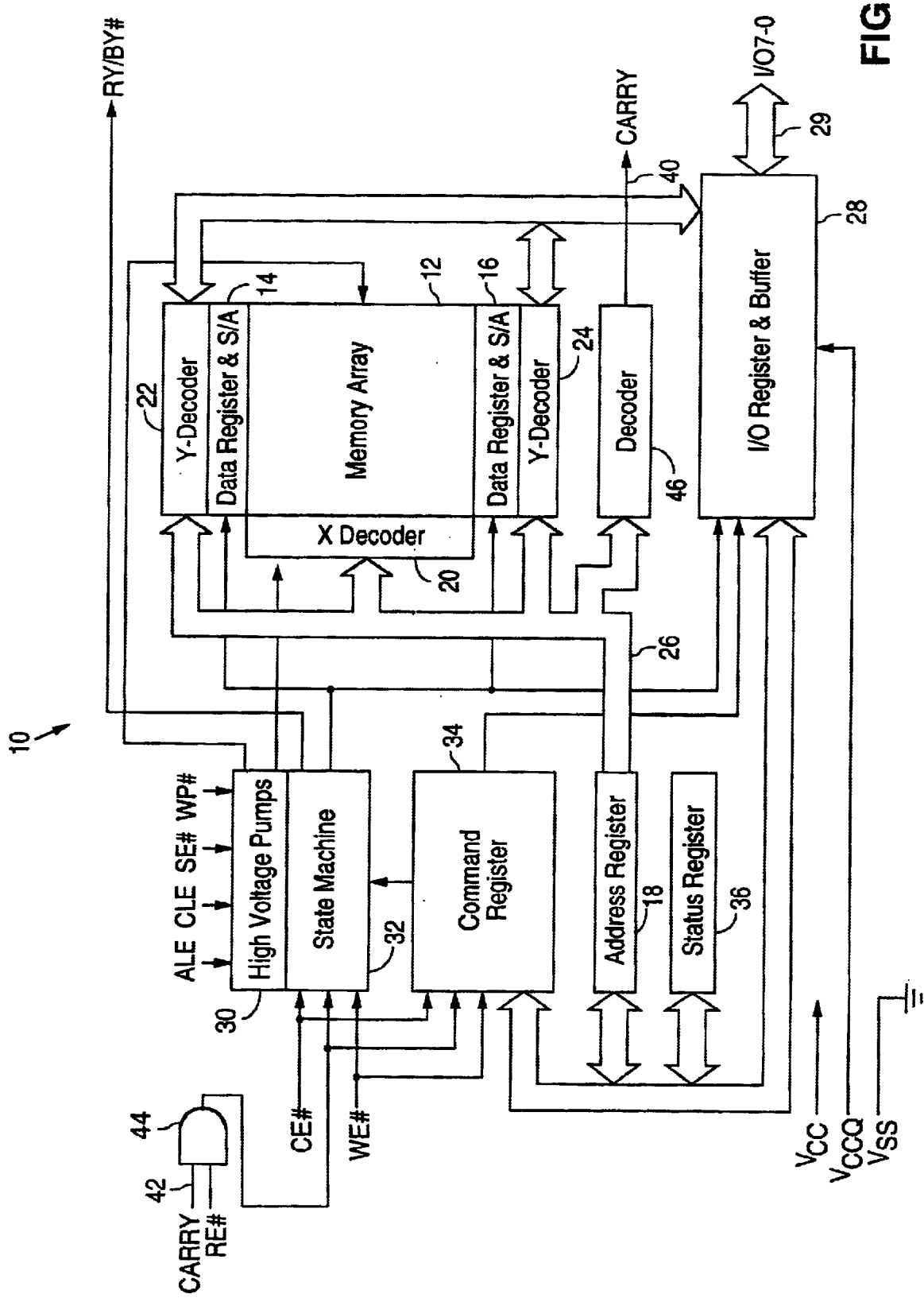
FIG. 1 is a block diagram illustrating a sequential access memory according to the present invention.

FIG. 1 is a simplified block diagram of the AMD Am30LV0064D UltraNAND™ memory which has been modified to embody the features of the present invention. It will be understood that this particular memory is being used to describe the principles of the invention, and that the invention is not limited to this example. Conversely, the features of the invention can be applied to any memory having a suitable configuration.

A memory 10 embodying the present invention comprises an array 12 of memory elements or cells which are capable of storing data. The elements of the UltraNAND memory are based on a non-volatile "flash" configuration, although the scope of the invention is not so limited. The detailed configuration and operation of the UltraNAND memory per se are not the particular subject matter of the present invention, and are described in data books available from AMD.

The memory 10 further includes input/output storage elements 14 and 16 in the form of data registers. Data is written into or read out of the individual memory elements via the registers 14 and 16 under control of an address register 18 which specifies a write or read address in the array 12. The address is decoded by an X decoder 20 and Y decoders 22 and 24 for memory access. An address bus 26 interconnects the address register 18 and the decoders 20, 22 and 24. An 8-bit I/O register and buffer 28 enables input and output of commands and data via an 8-bit I/O bus 29.

Data is written into the array 12 by serially inputting the data one byte at a time into the buffer 28, and therefrom into one of the registers 14 and 16. Data is transferred in parallel one page or one half-page at a time from the register 14 or 16 into the array 12. This operation is reversed for reading data out of the array. The details of the read operation will be described below.

Further illustrated are high voltage pumps 30 which boost the nominal 3.0V applied operating voltage of the memory 10 to higher and/or negative voltages as required for the flash memory reading, writing and erasing operations. A state machine 32 sequences the operations of the memory 10 in response to input pulses. A command register 34 is provided to store a command which is to be executed by the memory 10. A status register 36 stores information regarding the status of the memory 10.

The UltraNAND memory 10 utilizes a multiplexed address/data bus arrangement. All command, address, and data information is passed to and from the device through I/O[0 . . . 7] (the bus 29). Control signals are applied to the memory 10 for CE# (Chip Enable), CLE# (Command Latch Enable), ALE (Address Latch Enable), RE# (Read Enable), WE# (Write Enable), SE# (Spare Area Enable), and WP# (Write Protect). There is also an open drain RY/BY# (Ready/Busy) output pin used to indicate when the memory 10 is busy with an internal operation.

Whereas the bus 29 functions as an output bus for read operations, an input or command bus is considered for the purposes of the present invention to include the signal inputs CE#, RE#, WE#, SE#, ALE, CLE and WP#.

In accordance with the present invention, the UltraNAND memory 10 (or other suitable memory) is modified to include a carry-out pin 40 and a carry-in pin 42. An input CARRY signal is applied to the pin 42 which is connected to the input of an AND gate 44 or other suitable logic element. The read enable signal RE# is applied to another input of the AND gate 44, the output of which is applied to inputs of the state machine 32 and command register 34.

A decoder 46 is also provided in accordance with the present invention to produce an output CARRY signal on the pin 40 when the address in the address register has incremented to the last address of the second to last page or half-page in the array 12 as will be described in detail below.

Figure 2:
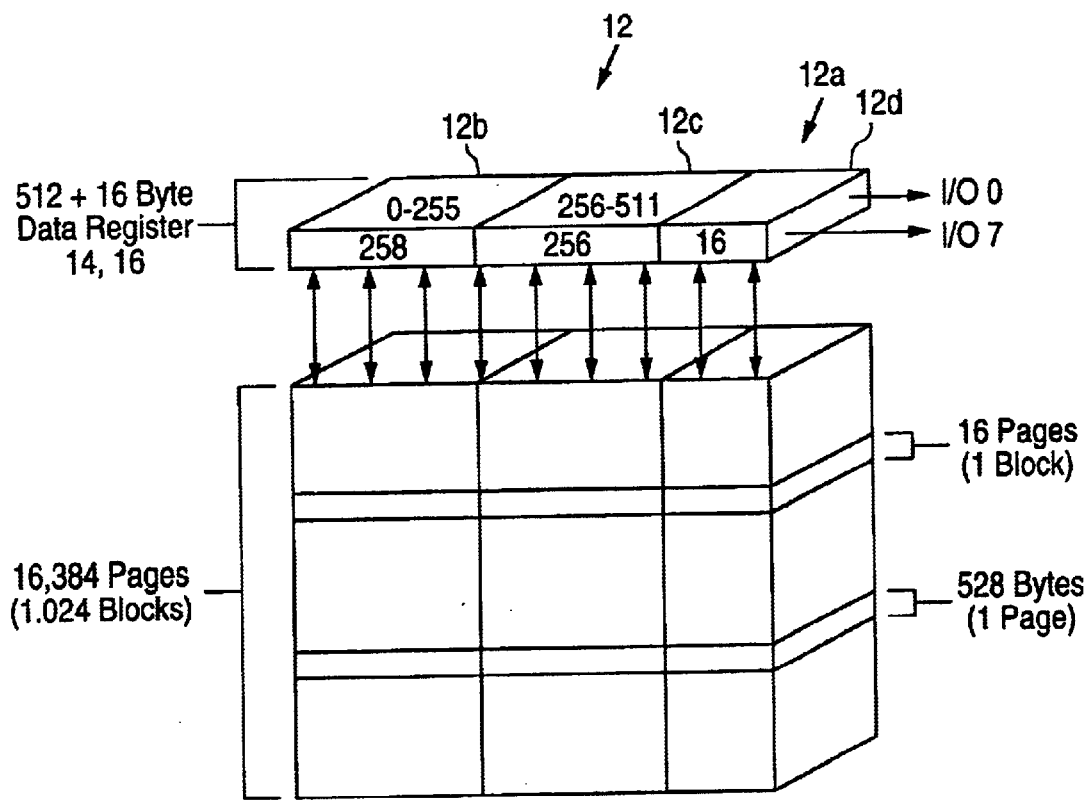
FIG. 2 is a diagram illustrating the arrangement of sections of memory elements in the memory of FIG. 1.

FIG. 2 illustrates the arrangement of memory elements in the array 12. The memory elements are arranged in 16,384 pages of 528 bytes each (each byte consists of 8 one-bit memory elements). Each page 12a consists of two half-pages 12b and 12c and a spare area 12d. The first half-page 12b stores bytes 0–255, the second half-page stores bytes 256–511, and the spare area 12d stores 16 bytes of auxiliary data. The spare area 12d is not the particular subject matter of the present invention and will be specifically excluded from further description.

Excluding the spare area 12d, each page or half-page in the array and storage can be considered to constitute a section of memory elements. In the arrangement illustrated in FIG. 2, each section comprises one page of data. Each data register 14 and 16 can store 512 bytes (one page) of data, in which case one section consists of 512 bytes. For reading, one page of data is loaded into one of the data registers 14 and 16 from the array while one page of data is being output from the other data register 14 or 16 via the buffer 28 and output bus 29 in a "ping-pong" manner.

Figure 3:
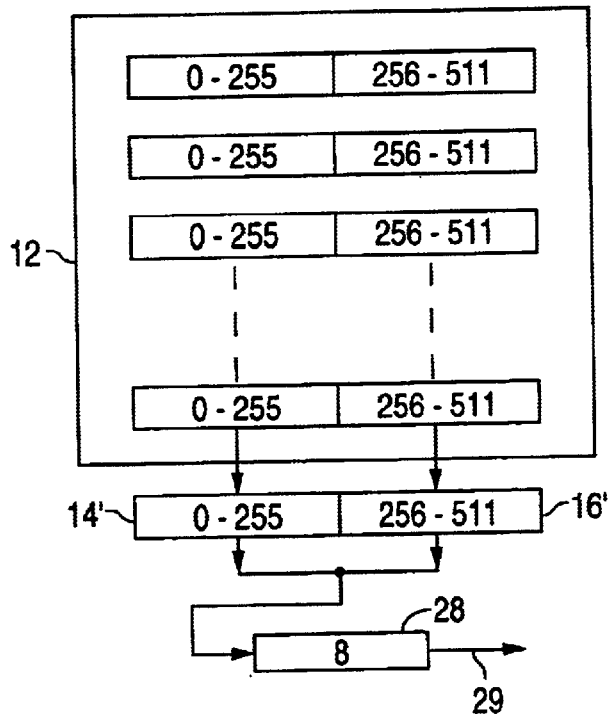
FIG. 3 is a diagram illustrating how half-page sections of memory elements are loaded and read out concurrently.

In another embodiment of the invention as illustrated in FIG. 3, each data register 14' and 16' can store 256 bytes (one-half page), in which case one section consists of 256 bytes. For reading out the data in the array 12, one-half page of data is loaded into one of the data registers 14' and 16' from the array while 12 one-half page of data is being output from the other data register 14' or 16' via the buffer 28 and output bus 29.

In both cases, the data registers 14 and 16 can be considered as read-write storage sections. Although not explicitly illustrated, it is further within the scope of the invention to provide a single read-write storage including 256 or 512 byte sections corresponding to the registers 14,16 or 14',16' respectively.

Figure 4:
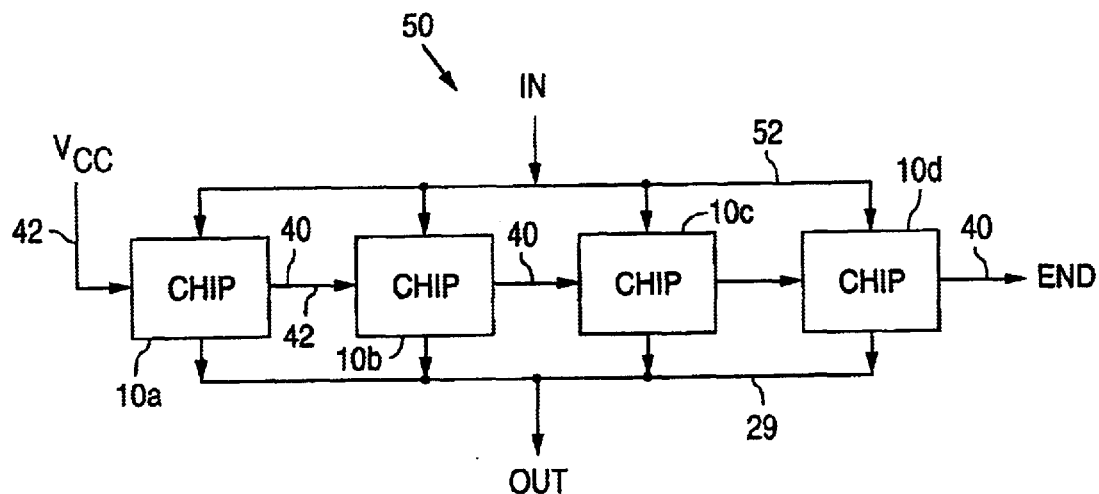
FIG. 4 is a diagram illustrating how a plurality of memories as shown in FIG. 1 are connected in a chain arrangement for continuous read to provide a memory array according to the present invention.

FIG. 4 illustrates a sequential access memory array 50 according to the present invention, including a plurality of memories 10a, 10b, 10c and 10d connected together in a chain arrangement. The signals CE#, RE#, WE#, SE#, ALE, CLE and WP# are applied to all of the memories in parallel via a command bus 52 as described above with reference to FIG. 1. The buffers 28 of the memories 10a to 10d are all connected to the output bus 29.

The carry-in pin 42 of the most upstream memory 10a is connected to a supply voltage Vcc such that the memory 10a can read out data without receiving a CARRY signal. The carry-out pin 40 of the memory 10a is connected to the carry-in pin 42 of the next downstream memory 10b. This arrangement continues down the chain of memories with the exception that the carry-out pin 40 of the most downstream memory 10d is not connected to a carry-in input and the output CARRY signal on the carry-out pin 40 of the memory 10d can be used to signal the end of a continuous read operation.

Figure 5:
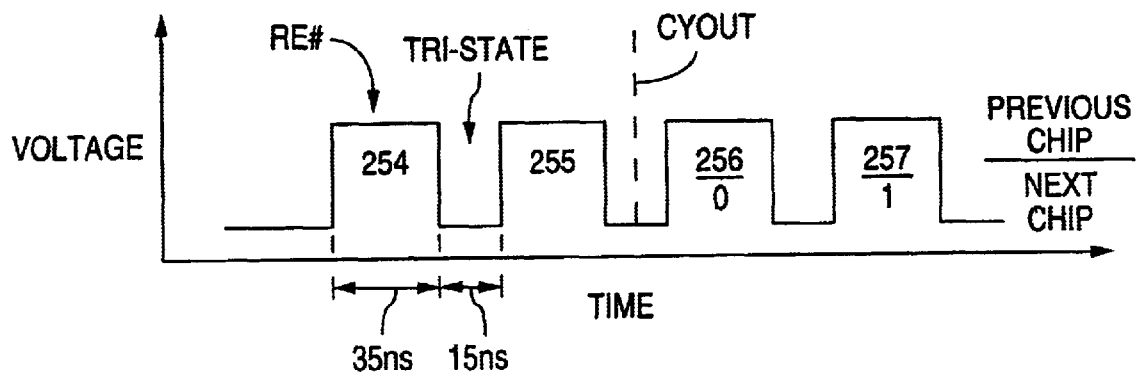
FIG. 5 is a timing diagram for the array of FIG. 4.

The operation of the memory array 50 is illustrated in FIG. 5, assuming the embodiment in which each register 14' and 16' constitutes a 256 byte (half-page) section of memory elements.

A gapless read command and the address of the first byte in the array 12 are entered into all of the memories 10a to 10d in parallel via the command bus 52 and buffer 29. Read enable pulses RE# are subsequently applied to all of the memories in parallel. However, the carry-out pins 40 of all of the memories 10a to 10d are all logically low, the carry-in pins 42 of the memories 10b to 10d are logically low, and the AND gates 44 of the memories 10b, 10c and 10d are inhibited. This prevents the read enable pulses RE# from being applied to the state machines 32 of the memories 10b, 10c and 10d, and these memories are initially prevented from reading out data.

The carry-in pin 42 of the most upstream memory 10a is connected to Vcc and is logically high. Thus, the AND gate 44 of the memory la is enabled, and the read enable pulses RE# pass therethrough to the state machine 32. The memory 10a executes a gapless read operation in which half-pages of data from the array 12 are alternatingly loaded into one of the data registers 14' and 16' and concurrently read out from the other of the data registers 14' and 16' onto the output bus 29 as described above.

As each sequential memory element or byte is loaded or read, the address register 18 is incremented to the next address by a counter in the state machine 32. The decoder 46 is configured to generate a CARRY signal on its carry-out pin 40 when the address in the address register 18 has been incremented to the last address 255 (256th byte) in the first half of the last page. As illustrated in FIG. 5, the CARRY signal is generated when the address is incremented to byte 255 of the 16,384th page.

The CARRY signal from the pin 40 of the memory 10a is applied to the carry-in pin 42 of the chip 10b, and the AND gate 44 of the memory 10b is enabled to pass the read enable pulses RE# to the state machine 32 and thereby enable data to be read out of the array 12 of the memory 10b. In response to read pulse RE# 256 as illustrated in FIG. 5, the first byte 256 of the last half-page in the memory 10a is output to the bus 29 from the register 14' or 16', and concurrently the same read pulse causes the first byte 0 of the first half-page in the memory 10d to be loaded into its data register 14' or 16'.

This operation continues until the entire last half-page of the memory 10a has been read out onto the bus 29 and the entire first half-page of the memory 10b has been loaded into its register 14' or 16'.

Next, the memory 10a goes into an inactive state because all of its data has been read out. The read operation of the memory 10b continues until all of its data has been read out. When the data has been read out of the first half of the last page of the memory 10b, it generates a CARRY signal which is applied to the next downstream memory 10c in the chain in the manner described above.

This continues until all of the memories 10a to 10d have been read out sequentially. The only latency period for the entire continuous read operation of all of the memories occurs as the first half-page of data is loaded into the register 14 or 16 of the first memory 11a.

In the above example, it was assumed that the memory arrays 12 were read out one-half page at a time. It is further within the scope of the invention to read out data one page at a time as described above. In this case, the decoder 46 would generate CARRY signal after the address is incremented to the last byte 511 of the next-to-last page. The scope of the invention yet further includes reading out data in less than one-half page or more than one page sections.

In order for the memories 10a to 10d to be read out seamlessly, it is necessary to prevent contention for the bus 29. This is accomplished by assuring that only one memory is operatively connected to the bus 29 at any time.

This occurs automatically in the UltraNAND memory as illustrated in FIG. 5. Each memory goes into a tri-state condition (high impedance or floating state) after the last byte has been read out, and is thereby effectively disconnected from the bus 29.

Each read enable pulse RE# h as a duration of 35 nanoseconds during which it causes the buffer 28 to output data onto the bus 29. There is a latency of 15 nanoseconds between the 35 nanosecond RE# pulses during which the buffer 28 is tri-stated. As such, there is a 15 nanosecond tri-state condition after the last byte is read out of one memory and the first byte is read out from the next memory in the chain. This assures that the previous memory chip is disconnected from the bus 29 before the next memory chip is connected thereto.

Although bus contention is automatically obviated in the UltraNAND memory, it may be necessary to provide a separate mechanism to accomplish this in other configurations. Such is also contemplated within the scope of the present invention.

In summary, the present invention overcomes the limitations of the prior art by providing a sequential access memory which can be chained together with similar memories to form a memory array that can be read out continuously with only a single latency period at the begging of the operation.

Various modifications will become possible for those skilled in the art after receiving the teachings of the present disclosure without departing from the scope thereof.

INDUSTRIAL APPLICABILITY

The invention is applicable to the fabrication of microelectronic integrated circuit memories, and to the assembly of a plurality of sequential access memories into a structure such that the memories can be read continuously.

What is claimed is:

1. A sequential access memory structure, comprising:
   an output bus; and
   a plurality of separate sequential access memories coupled together in a chain arrangement, each of which is individually coupled to the output bus and includes:
   a memory array having a plurality of sequentially readable memory elements;
   a carry output for producing a carry signal when reading of the array has been substantially completed; and
   a carry input for causing reading of the array in response to a carry signal, in which:
   the carry output of each memory is connected to a carry input of one other memory respectively in a chain arrangement; and
   the carry signals cause the memory elements of the arrays to be read sequentially onto the output bus.

2. A memory structure as in claim 1, further comprising a command bus, in which:
   each memory is connected to the command bus; and
   a read command applied to the command bus enables the arrays to be read sequentially in response to the carry signals respectively.

3. A memory structure as in claim 2, in which the read command is a gapless read command.

4. A memory structure as in claim 2, in which the carry input of a most upstream memory in said chain arrangement is connected such that the array of the upstream memory will be read onto the output bus in response to the read command without receiving a carry signal.

5. A memory structure as in claim 1, in which each memory further comprises a read-write storage connected between the array and the output bus, the storage including a plurality of sections; and data from the array is loaded into one section of the storage while data is being read from another section of the storage onto the output bus.

6. A memory structure as in claim 5, in which:

each array comprises a plurality of sections of memory elements;

each section of each storage comprises a plurality of memory elements; and a number of memory elements in each section of each array is the same as a number of memory elements in each section of each storage.

7. A memory structure as in claim 6, in which the carry output produces the carry signal prior to reading data from a last section of an array out of a storage onto the output bus.

8. A memory structure as in claim 7, in which:

each memory includes an address counter for sequentially addressing the memory elements; and the carry output is controlled by the address counter.

9. A memory structure as in claim 6, in which:

the sections of memory elements in each array comprise half-pages;

each storage comprises two sections, each of which has a half-page of memory elements; and the carry output produces the carry signal prior to reading data from a last half-page of an array out of a storage onto the output bus, such that the data from the last half-page is read onto the output bus while data from a first half-page of an array of a next downstream memory is being loaded into its storage.

10. A memory structure as in claim 6, in which:

the sections of memory elements in each array comprise pages;

each storage comprises two sections, each of which has a page of memory elements; and the carry output produces the carry signal prior to reading data from a last page of an array out of a storage onto the output bus, such that the data from the last page is read onto the output bus while data from a first page of an array of a next downstream memory is being loaded into its storage.

11. A memory structure as in claim 1, in which each memory is configured such that it will be connected to the output bus only while its array is being read onto the output bus.

12. A sequential access memory, comprising:

a data output;

a plurality of separate sequential access memories coupled together in a chain arrangement, each of which is individually coupled to the data output and comprises:

a memory array having a plurality of sequentially readable memory elements;

a carry output for producing a carry signal when reading of the array has been substantially completed; and a carry input for causing reading of the array to the data output in response to a carry signal, wherein the carry signals cause the memory elements of the arrays to be read sequentially onto the data output.

13. A memory as in claim 12, further comprising a command input, in which a read command applied to the command input enables the array to be read in response to a carry signal.

14. A memory as in claim 13, in which the read command is a gapless read command.

15. A memory as in claim 13, in which the carry input is configurable such that the array can be read to the data output in response to the read command without receiving a carry signal.

16. A memory as in claim 12, further comprising a read-write storage connected between the array and the data output, the storage including a plurality of sections, in which data from the array is loaded into one section of the storage while the data is being read from another section of the storage to the data output.

17. A memory as in claim 16, in which:

the array comprises a plurality of sections of memory elements;

each section of the storage comprises a plurality of memory elements; and a number of memory elements in each section of the array is the same as a number of memory elements in each section of the storage.

18. A memory as in claim 17, in which the carry output produces the carry signal prior to reading data from a last section of the array out of the storage to the data output.

19. A memory as in claim 18, further comprising an address counter for sequentially addressing the memory elements, in which the carry output is controlled by the address counter.

20. A memory as in claim 17, in which:

each section of memory elements in the array comprises a half-page;

the storage comprises two sections, each of which has a half-page of memory elements; and the carry output produces the carry signal prior to reading data from a last half-page of the array out of the storage to the data output.

21. A memory as in claim 17, in which:

each section of memory elements in the array comprises a page;

the storage comprises two sections, each of which has a page of memory elements; and the carry output produces the carry signal prior to reading data from a last page of the array out of the storage to the data output.

22. A memory as in claim 12, in which the memory is configured such that its data output will be active only while the array is being read.

* * * * *